US006642100B2

(12) United States Patent
Yang et al.

(10) Patent No.: US 6,642,100 B2
(45) Date of Patent: Nov. 4, 2003

(54) SEMICONDUCTOR DEVICE WITH CAPACITOR STRUCTURE HAVING HYDROGEN BARRIER LAYER AND METHOD FOR THE MANUFACTURE THEREOF

(75) Inventors: Bee-Lyong Yang, Ichon-shi (KR); Seaung-Suk Lee, Ichon-shi (KR); Suk-Kyoung Hong, Ichon-shi (KR); Nam-Soo Kang, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/892,538

(22) Filed: Jun. 28, 2001

(65) Prior Publication Data

US 2002/0020868 A1 Feb. 21, 2002

(30) Foreign Application Priority Data

Jul. 6, 2000 (KR) .................................... 2000-38543

(51) Int. Cl.[7] ........................................ H01L 21/8242
(52) U.S. Cl. .................................... 438/253; 438/396
(58) Field of Search ............................. 257/303, 304, 257/306, 307, 308, 309; 438/239, 253, 254, 255, 393, 396, 397, 398

(56) References Cited

U.S. PATENT DOCUMENTS 5,438,023 A * 8/1995 Argos et al. .................. 438/3
6,083,832 A * 7/2000 Sugai ......................... 438/672
6,225,656 B1 * 5/2001 Cuchiaro et al. ........... 257/295
6,242,299 B1 * 6/2001 Hickert ....................... 438/240
6,249,014 B1 * 6/2001 Bailey ........................ 257/295
6,355,952 B1 * 3/2002 Yamoto et al. ............. 257/295

FOREIGN PATENT DOCUMENTS

JP 020000915 A * 3/2000

* cited by examiner

*Primary Examiner*—Long Pham
*Assistant Examiner*—Hoai Pham
(74) *Attorney, Agent, or Firm*—Jacobson Holman PLLC

(57) ABSTRACT

A semiconductor device for use in a memory cell including an active matrix provided with a transistor and a first insulating layer formed around the transistor; a capacitor structure, formed on top of the first insulating layer and composed of a bottom electrode, a capacitor thin film placed on top of the bottom electrode and a top electrode formed on top of the capacitor thin film; a second insulating layer formed on top of the transistor and the capacitor structure; a metal interconnection formed on top of the second insulating layer and the active matrix to electrically connect the transistor to the capacitor structure; and a hydrogen barrier layer formed on top of the metal interconnection, wherein the hydrogen barrier layer is made of an aluminum oxide ($Al_xO_y$) layer.

11 Claims, 5 Drawing Sheets

100

140 134 138 140 144 136 125 150 126 110 106A 106

SEMICONDUCTOR DEVICE WITH CAPACITOR STRUCTURE HAVING HYDROGEN BARRIER LAYER AND METHOD FOR THE MANUFACTURE THEREOF

FIELD OF THE INVENTION

The present invention relates to a semiconductor device and, more particularly, to a semiconductor device having a capacitor structure for use in a memory cell and a method for the manufacture thereof.

DESCRIPTION OF THE PRIOR ART

As is well known, a dynamic random access memory (DRAM) with a memory cell comprised of a transistor and a capacitor has a higher degree of integration mainly by down-sizing through micronization. However, there is still a demand for downsizing the area of the memory cell.

To meet this demand, several methods have been proposed, such as a trench type or a stack type capacitor, which is arranged three-dimensionally in a memory device to reduce the cell area available to the capacitor. However, the process of manufacturing a three-dimensionally arranged capacitor is a long and tedious one and consequently incurs high manufacturing costs. Therefore, there is a strong demand for a new memory device that can reduce the cell area while securing a requisite volume of information without requiring complex manufacturing steps.

Thus, to meet the demand, DRAM devices employ a high dielectric material as a capacitor thin film, such as barium strontium titanate (BST) and tantalum oxide ($Ta_2O_5$). While DRAM is small, inexpensive, fast, and expends little power, DRAM memory has problems in that it is volatile and has to be refreshed many times each second.

In an attempt to solve the above problems of conventional DRAM, there has been proposed a ferroelectric random access memory (FeRAM) where a capacitor thin film with ferroelectric properties such as strontium bismuth tantalate (SBT) and lead zirconate titanate (PZT) is used for a capacitor in place of a conventional silicon oxide film or a silicon nitride film. FeRAM has a non-volatile property due to remnant polarization of a ferroelectric material and it can operate at lower voltages.

In manufacturing a memory device such as DRAM and FeRAM, there is a step of forming a passivation layer on top of a metal interconnection layer, for protecting the semiconductor device from exposure to detrimental environmental factors such as moisture, particles or the like. The passivation layer is formed by using a method such as plasma enhanced chemical vapor deposition (PECVD) in hydrogen rich ambient. However, during the formation of the passivation layer, the hydrogen gas generated by the PECVD process degrades the capacitor of the memory cell. That is, the hydrogen gas and ions penetrate to a top electrode and a side of the capacitor, reaching to the capacitor thin film and reacting with oxygen atoms constituting the ferroelectric material of the capacitor thin film.

In addition, while an inter-metal dielectric, such as one made of a spin on glass base, is formed after a formation of a metal interconnection, hydrogen atoms may diffuse into the capacitor, thereby degrading the capacitor structure.

These problems, therefore, tend to make it difficult to obtain the desired reproducibility, reliability and yield in fabricating the memory cell.

SUMMARY OF THE INVENTION

It is, therefore, an object of the present invention to provide a semiconductor device incorporating therein a hydrogen barrier layer provided with an aluminum oxide ($Al_xO_y$) layer to protect a capacitor from hydrogen damage during the formation of an inter-metal dielectric (IMD) layer and a passivation layer.

It is another object of the present invention to provide a method for manufacturing a semiconductor device incorporating therein a hydrogen barrier layer provided with an aluminum oxide ($Al_xO_y$) layer to protect a capacitor from hydrogen damage during the formation of the IMD layer and the passivation layer.

In accordance with one aspect of the present invention, there is provided a semiconductor device for use in a memory cell, including an active matrix provided with a transistor and a first insulating layer formed around the transistor; a capacitor structure, formed on top of the first insulating layer, composed of a bottom electrode, a capacitor thin film placed on top of the bottom electrode and a top electrode formed on top of the capacitor thin film; a second insulating layer formed on top of the transistor and the capacitor structure; a metal interconnection formed on top of the second insulating layer and the active matrix to electrically connect the transistor to the capacitor structure; and a hydrogen barrier layer formed on top of the metal interconnection, wherein the hydrogen barrier layer is made of an aluminum oxide ($Al_xO_y$) layer.

In accordance with another aspect of the present invention, there is provided a method for manufacturing a semiconductor device including the steps of a) preparing an active matrix provided with a transistor and a first insulating layer formed around the transistor; b) forming a capacitor structure on top of the first insulating layer, wherein the capacitor structure includes a capacitor thin film made of a ferroelectric material; c) forming a second insulating layer on top of the capacitor structure and transistor; d) forming a metal interconnection layer and patterning the metal interconnection into a predetermined configuration to electrically connect the transistor to the capacitor structure; and e) forming a hydrogen barrier layer provided with an aluminum oxide ($Al_xO_y$) on top of the metal interconnection.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 1:
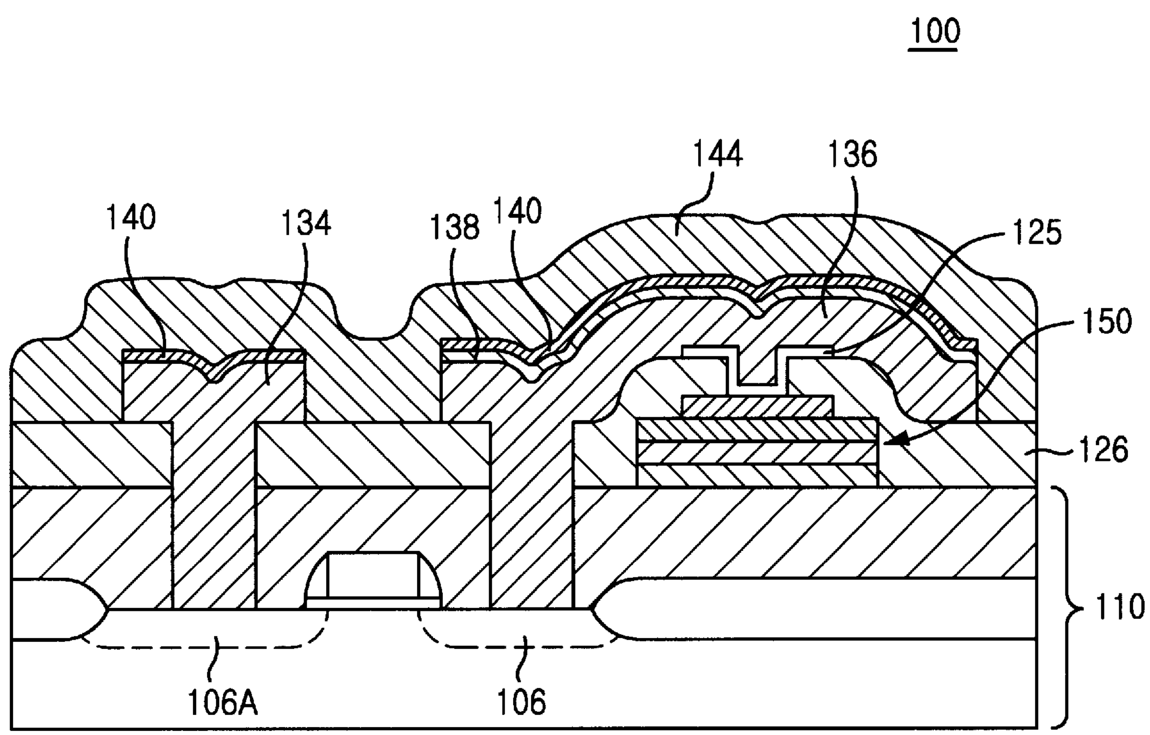
FIG. 1 is a cross sectional view setting forth a semiconductor device in accordance with a preferred embodiment of the present invention.

There are provided in FIG. 1 and FIGS. 2A to 2G cross sectional views of a semiconductor device 100 for use in a memory cell and cross sectional views setting forth a method for the manufacture thereof in accordance with a preferred embodiment of the present invention. It should be noted that like parts appearing in FIG. 1 and FIGS. 2A to 2G are represented by like reference numerals.

In FIG. 1, there is provided a cross sectional view of the inventive semiconductor device 100 including an active matrix 110, a capacitor structure 150, a second insulating layer 126, a bit line 134, a metal interconnection 136, a hydrogen barrier layer 138 provided with an aluminum oxide ($Al_xO_y$) layer, and an inter-metal dielectric (IMD) layer 140 formed on the bit line 134 and the hydrogen barrier layer 138. In the embodiment of the present invention, the IMD layer 140 is formed in a shape of a triple layer provided with a SiON layer having a thickness of about 100 nm, a SOG layer having a thickness of about 400 nm and a SRO (silicon rich oxide) layer having a thickness of about 400 nm. The IMD layer 140 is accomplished by using a method such as the CVD or the PVD. The hydrogen barrier layer 138 is formed to a thickness ranging from 2 nm to 100 nm by using a method such as an atomic layer deposition (ALD) and a physical vapor deposition (PVD). Here, the hydrogen barrier layer 138 plays a role in preventing the capacitor of the semiconductor device 100 from being degraded by hydrogen penetration thereinto, because the diffusion velocities of hydrogen atoms markedly decrease in the $Al_xO_y$ layer.

In addition, a passivation layer 144 is formed on top of the bit line 134, the IMD layer 140 and the second insulating layer 126 by using a plasma enhanced chemical vapor deposition (PECVD) technique, which is carried out at a high temperature ranging from approximately 320° C. to approximately 400° C., in hydrogen rich ambient. In the present invention, the passivation layer 144 is a double layer provided with an undoped silicate glass (USG) layer and a $Si_3N_4$ layer.

In the semiconductor device 100, the bit line 134 is electrically connected to a diffusion region 106A and a top electrode of the capacitor structure 150 is electrically connected to another diffusion region 106 through the metal interconnection 136, such that the bit line 134 and the metal interconnection 136 are electrically disconnected from each other. A bottom electrode of the capacitor structure 150 may be connected to a plate line (not shown) to apply a common constant potential thereto. Further, between the bottom and the top electrodes, there is a capacitor thin film made of a ferroelectric material such as SBT ($SrBiTaO_x$), PZT ($PbZrTiO_x$) or the like. Here, a reference numeral 125 denotes a TiN adhesion layer formed on the top electrode, for enhancing the connection between the top electrode and the metal interconnection 136.

FIGS. 2A to 2G are schematic cross sectional views setting forth the method for manufacture of a semiconductor memory device 100 in accordance with the preferred embodiment of the present invention.

Figure 2A:
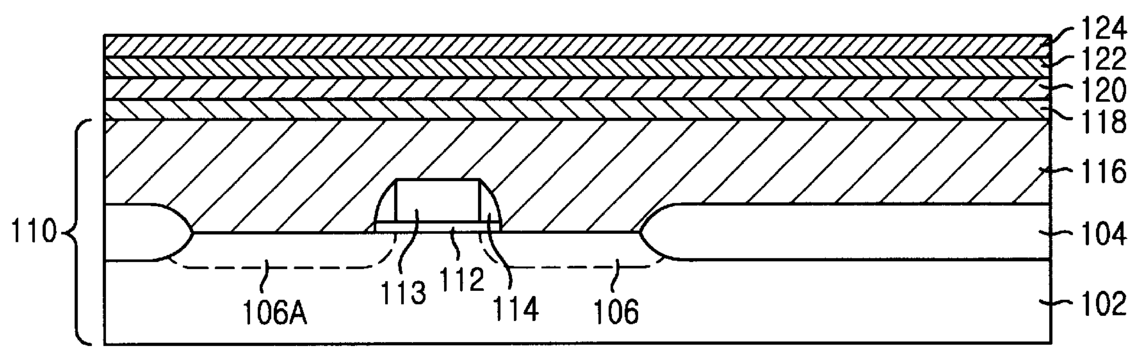
FIGS. 2A to 2G are cross sectional views setting forth a method for the manufacture of the semiconductor memory device in accordance with the present invention.

The process for manufacturing the semiconductor device 100 begins with the preparation of an active matrix 110 including a semiconductor substrate 102, an isolation region 104, diffusion regions 106, 106A, a gate oxide 112, a gate line 113, a spacer 114 and a first insulating layer 116, as shown in FIG. 2A. One of the diffusion regions serves as a source and the other diffusion region serves as a drain. The first insulating layer 116 is made of a material such as boron-phosphor-silicate glass (BPSG) or medium temperature oxide (MTO) or the like.

Thereafter, a buffer layer 118, e.g., made of Ti or $TiO_x$, is formed on top of the first insulating layer 116 with a thickness ranging from 50 nm to 250 nm. A first metal layer 120, a dielectric layer 122 and a second metal layer 124 with a thickness in the range of 20 nm to 200 nm are formed on top of the buffer layer 118, subsequently. In the preferred embodiment, the dielectric layer 122 is made of a ferroelectric material such as strontium bismuth tantalate (SBT), lead zirconate titanate (PZT) or the like and is formed by using a method such as a spin coating or a chemical vapor deposition (CVD).

Figure 2B:
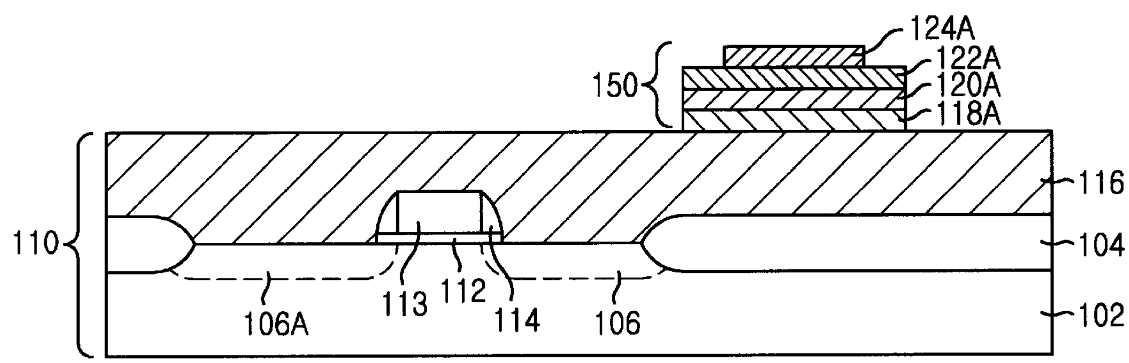

In an ensuing step as shown in FIG. 2B, the second metal layer 124 is patterned into a first predetermined configuration to obtain a top electrode 124A and a capacitor thin film 122A. The dielectric layer 122, the first metal layer 120 and the buffer layer 118 are then patterned into a second predetermined configuration to obtain a capacitor thin film 122A and a bottom electrode structure, thereby forming a capacitor structure 150 having a buffer 118A, a bottom electrode 120A, a capacitor thin film 122A and a top electrode 124A. It is preferable that the bottom electrode 120A have a size different from that of the top electrode 124A in order to form a plate line (not shown) during the following processes.

Figure 2C:
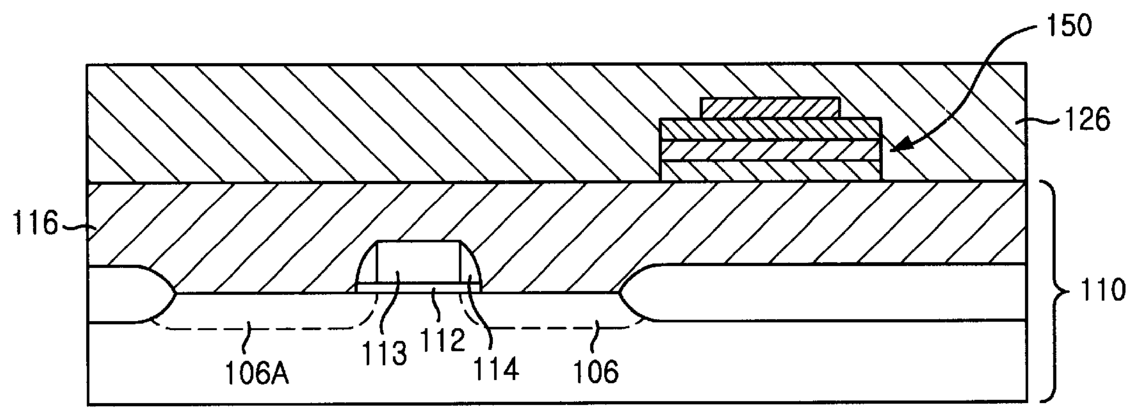

In a next step as shown in FIG. 2C, a second insulating layer 126, made of a material such as BPSG, MTO or double layer consisting of BPSG and tetra-ethyl-ortho-silicate (TEOS)-based oxide, is formed on top of the capacitor structure 150 and the first insulating layer 116 by using a method such as CVD. The second insulating layer 126 is flattened by means of a BPSG flow process or chemical mechanical polishing (CMP), as shown in FIG. 2C. In order to densify the second insulating layer 126, an annealing process is carried out at a temperature ranging from approximately 500° C. to approximately 900° C. for at least 10 minutes in $N_2/O_2$ ambient.

Figure 2D:
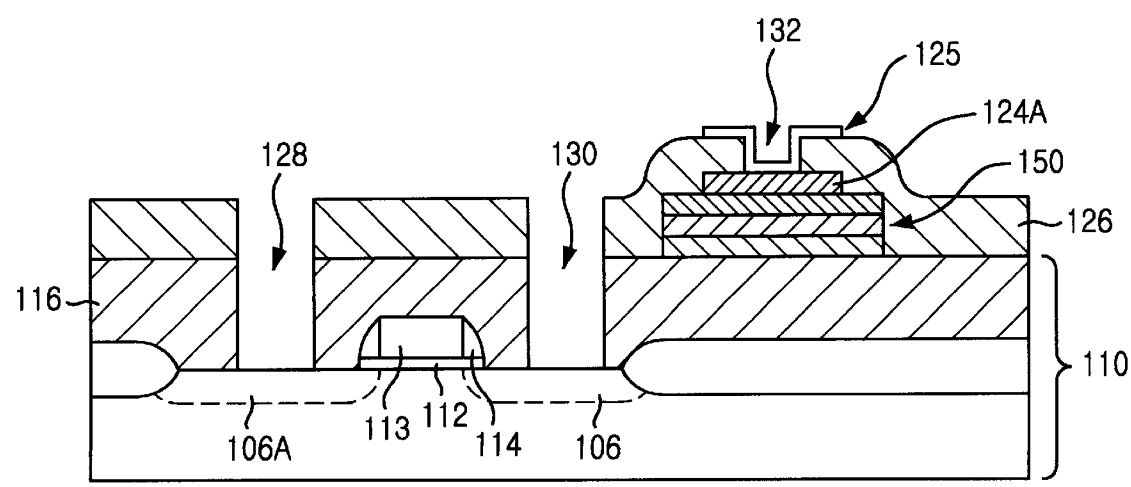

In an ensuing step, as shown in FIG. 2D, a first opening 128 and a second opening 130 are formed at positions over the diffusion regions 106A, 106 through the second and the first insulating layers, 126, 116, respectively, by using a method such as a photolithography and a plasma etching, e.g., reactive ion etching (RIE). A third opening 132 is formed at a position over the capacitor structure 150 through the second insulating layer 126 by using a method such as photolithography and plasma etching. Finally, a TiN layer 125 is formed on top electrode 124A of the capacitor structure 150 through the third opening 132, for enhancing the connection between the top electrode 124A and a metal interconnection 136. But, the TiN layer 125 may be omitted.

Figure 2E:
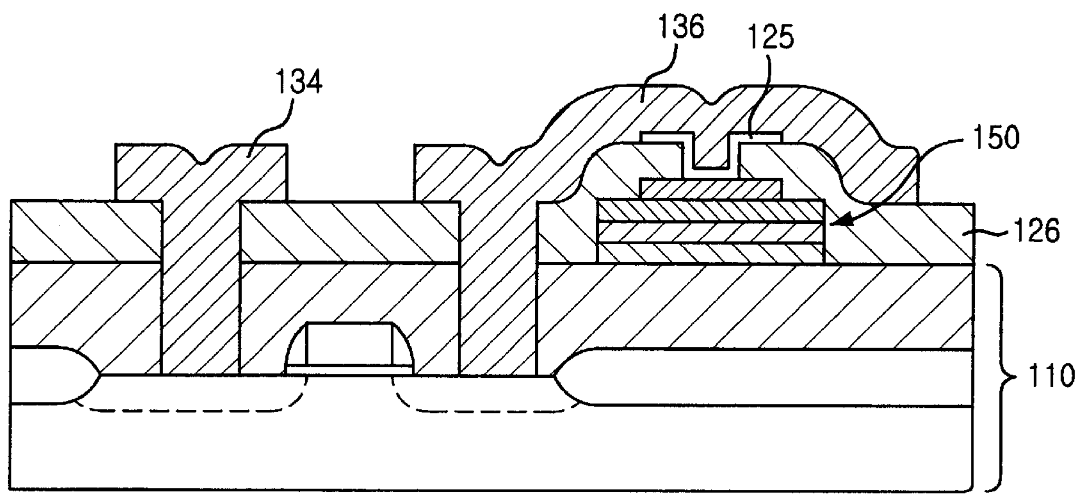

Thereafter, the metal interconnection layer, e.g., made of Ti/TiN/Al, is formed over the entire surface including the interiors of the openings 128, 130, 132 and is patterned into a third configuration to form a bit line 134 and a metal interconnection 136, as shown in FIG. 2E.

Figure 2F:
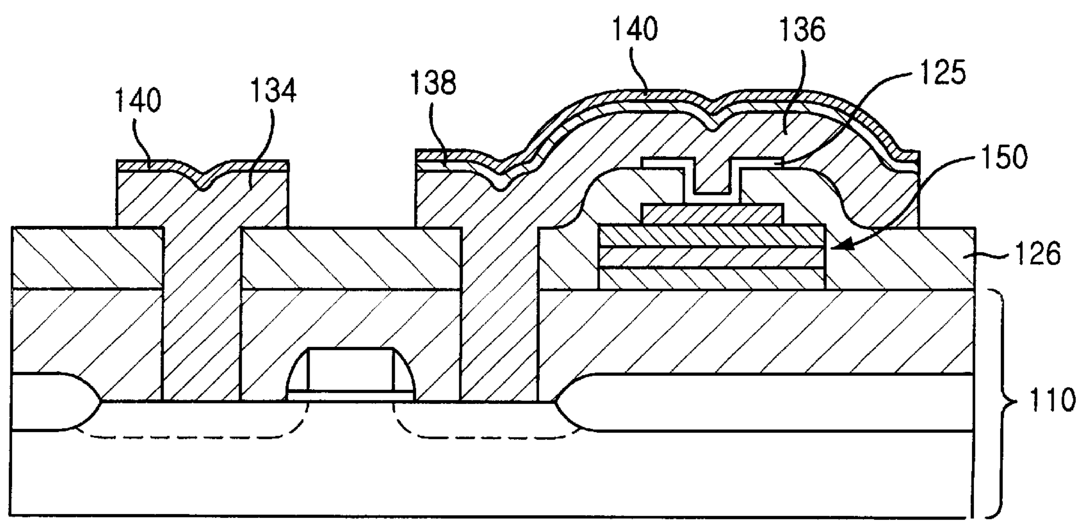

In a next step, as shown in FIG. 2F, a hydrogen barrier layer 138 made of an aluminum oxide layer ($Al_xO_y$) is formed on top of the metal interconnection 136 by using a method such as an atomic layer deposition (ALD) and a physical vapor deposition (PVD). Thereafter, an inter-metal dielectric (IMD) layer 140 made of a spin on glass (SOG) layer is formed on top of the bit line 134 and the hydrogen barrier layer 138. In the embodiment of the present invention, the IMD layer 140 is formed in the shape of a triple layer provided with a SiON layer of 100 nm, a SOG layer of 400 nm and a SRO (silicon rich oxide) layer of 400 nm. The IMD layer is formed by using a method such as the CVD or the PVD. It is noted that the hydrogen barrier layer 138 should cover the capacitor structure 150 sufficiently to protect the capacitor structure 150 effectively from hydrogen damage.

Figure 2G:
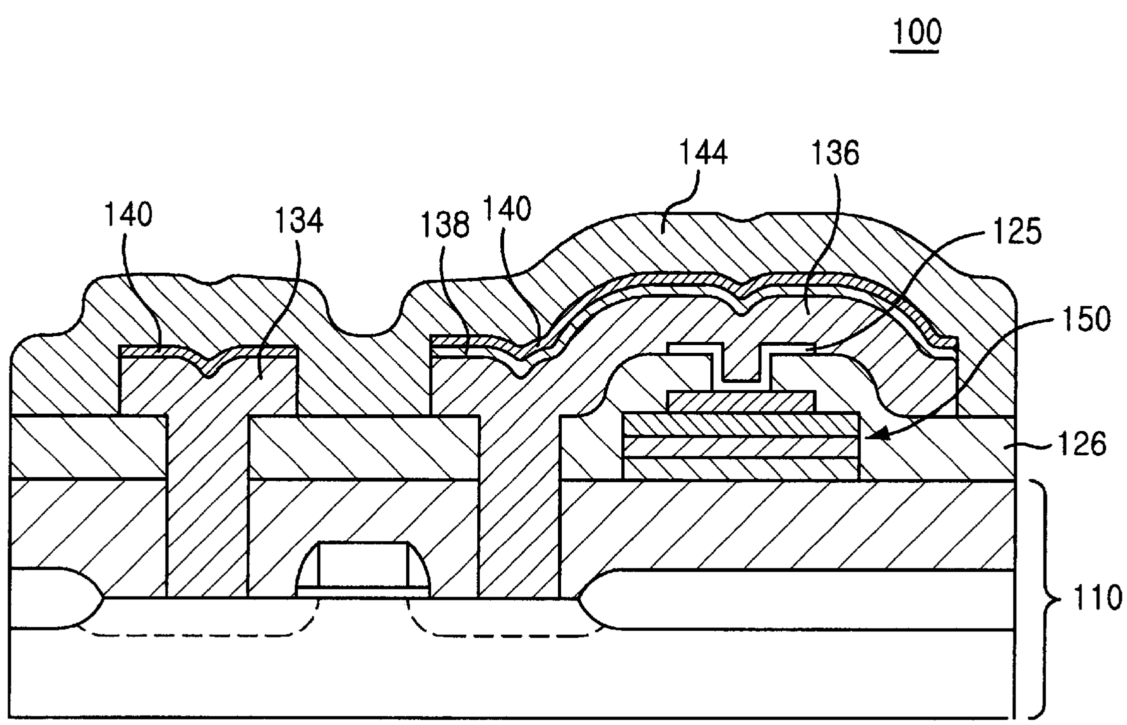

Finally, as shown in FIG. 2G, a passivation layer 144, e.g., a double layer provided with an undoped silicate glass (USG) and $Si_3N_4$, is formed on the entire surface by using a method such as a plasma enhanced chemical vapor deposition (PECVD) method to protect the semiconductor device 100 from exposure to detrimental environmental factors such as moisture, particles or the like. The formation of the passivation layer is carried out at a high temperature ranging from approximately 320° C. to 400° C., in hydrogen rich ambient.

By structuring the semiconductor device 100 of the present invention as aforementioned, it is possible to prevent the capacitor structure 150 from being damaged by hydrogen penetration thereinto. That is, by means of the formation of the hydrogen barrier layer 138 provided with the $Al_xO_y$ layer, hydrogen damage is effectively avoided because diffusion velocities of hydrogen atoms are remarkably decreased in the $Al_xO_y$ layer.

While the present invention has been described with respect to the particular embodiments, it will be apparent to those skilled in the art that various changes and modifications may be made without departing from the scope of the invention as defined in the following claims.

What is claimed is:

1. A method for manufacturing a semiconductor device, comprising the steps of:

preparing an active matrix provided with a transistor and a first insulating layer formed around the transistor;

forming a capacitor structure on top of the first insulating layer, wherein the capacitor structure includes a capacitor thin film made of a ferroelectric material between a top electrode and a bottom electrode;

forming a second insulating layer on top of the capacitor structure and the transistor;

forming a first contact hole exposing the top electrode and forming a second contact hole exposing a drain/source region of the transistor by selectively etching the second insulating layer;

forming a TiN adhesion layer on the top electrode for enhancing a connection between the top electrode and a subsequently applied metal interconnection layer;

forming the metal interconnection layer on top of said TiN adhesion layer and patterning the metal interconnection layer into a predetermined configuration to electrically connect the transistor to the capacitor structure, wherein the metal interconnection layer is connected to the top electrode via the TiN adhesion layer;

forming a hydrogen barrier layer provided with an aluminum oxide (AlxOy) layer on top of the metal interconnection; and forming an inter-metal dielectric (LMD) layer on top of the hydrogen barrier layer, wherein the LIVID layer is a triple layer provided with a SIGN layer, a SOG layer, and SRO layer.

2. The method as recited in claim 1, wherein the hydrogen barrier layer is formed to a thickness ranging from approximately 2 nm to approximately 100 nm by using a method selected from the group consisting of an atomic layer deposition (ALD) and a physical vapor deposition (PVD).

3. The method as recited in claim 1, wherein the metal interconnection includes a material selected from the group consisting of titanium (Ti), titanium nitride (TiN), aluminum (Al) and combinations thereof.

4. The method as recited in claim 1, further comprising a step of forming a passivation layer on top of the metal interconnection by using a plasma enhanced CVD in a hydrogen rich ambient.

5. The method as recited in claim 4, wherein the passivation layer is a double layer provided with an undoped silicate glass (USG) layer and a $Si_3N_4$ layer.

6. The method as recited in claim 4, wherein the passivation layer is formed at a temperature ranging from approximately 320° C. to approximately 400° C.

7. The method as recited in claim 1, wherein the capacitor thin film includes a material selected from the group consisting of SBT ($SrBiTaO_x$) and PZT ($PbZrTiO_x$).

8. The method as recited in claim 1, wherein the second insulating layer is a double layer provided with a boron-phosphor-silicate-glass (BPSG) layer and a tetra-ethyl-ortho-silicate (TEOS)-based oxide layer.

9. The method as recited in claim 1, after forming the second insulating layer, further comprising the step of annealing the second insulating layer for densification at a temperature ranging from approximately 500° C. to approximately 900° C. for at least 10 minutes in nitrogen and oxygen ambient.

10. The method as recited in claim 1, wherein the metal interconnection layer is formed of aluminum.

11. The method as recited in claim 1, wherein the TiN adhesion layer formed on the top electrode is formed to cover over only a partial portion of an area above said capacitor structure while said metal interconnection layer extends over all of said TiN adhesion layer as well as over all of the area above said capacitor structure.

* * * * *